US012739976B2

(12) United States Patent
Tsai

(10) Patent No.: US 12,739,976 B2
(45) Date of Patent: Sep. 15, 2026

(54) EMBEDDED INDUCTOR STRUCTURE AND MANUFACTURING METHOD THEREOF

(71) Applicant: UNIMICRON TECHNOLOGY CORP., Taoyuan City (TW)

(72) Inventor: Chen-An Tsai, Taoyuan City (TW)

(73) Assignee: UNIMICRON TECHNOLOGY CORP., Taoyuan City (TW)

( * ) Notice: Subject to any disclaimer, the term of this patent is extended or adjusted under 35 U.S.C. 154(b) by 737 days.

(21) Appl. No.: 18/136,358

(22) Filed: Apr. 19, 2023

(65) Prior Publication Data

US 2024/0314932 A1 Sep. 19, 2024

(30) Foreign Application Priority Data

Mar. 14, 2023 (TW) ................................ 112109398

(51) Int. Cl.

| | |
|---|---|
| ***H01F 17/00*** | (2006.01) |
| ***H01F 41/04*** | (2006.01) |
| ***H05K 1/11*** | (2006.01) |
| ***H05K 1/16*** | (2006.01) |
| ***H05K 3/46*** | (2006.01) |

(52) U.S. Cl.

CPC ......... *H05K 1/165* (2013.01); *H01F 17/0013* (2013.01); *H01F 41/041* (2013.01); *H05K 1/115* (2013.01); *H05K 3/4644* (2013.01); *H05K 2201/086* (2013.01); *H05K 2201/09527* (2013.01); *H05K 2201/09563* (2013.01); *H05K 2201/1003* (2013.01)

(58) Field of Classification Search

CPC ......... H01F 27/2804; H01F 2027/2809; H01F 17/0006; H01F 17/0013; H01F 5/003; H01F 41/041; H05K 1/165; H05K 3/4644; H05K 1/115; H05K 2201/086; H05K 2201/09527; H05K 2201/09563; H05K 2201/1003

USPC .................................................. 336/200, 232

See application file for complete search history.

(56) References Cited

U.S. PATENT DOCUMENTS 9,265,158 B2 2/2016 Mano et al.
9,854,671 B1 * 12/2017 Lin ....................... H05K 1/036
(Continued)

FOREIGN PATENT DOCUMENTS

CN 106208408 A * 12/2016 .......... H01F 27/323
CN 111 554486 A 8/2020
(Continued)

*Primary Examiner* — Tszfung J Chan
(74) *Attorney, Agent, or Firm* — WPAT, PC

(57) ABSTRACT

The present invention includes an aluminum board, an electromagnet core, and a coil. The aluminum board includes a first surface, a second surface opposite to the first surface, and multiple through vias in communication with the first surface and the second surface. The electromagnet core is mounted on the first surface, and the through vias are located on two opposite sides of the electromagnet core. The coil is mounted through the through vias to wrap around the electromagnet core. An inside wall of each of the through vias forms an anodic aluminum oxide (AAO) by an anodizing process. The present invention is able to decrease via size of a conductive through via of a vertically embedded inductor. This allows through vias to be more densely formed on a board, and thus increases an amount of the coil wrapped around the electromagnetic core and increases inductance of the inductor.

4 Claims, 13 Drawing Sheets

(56) References Cited

U.S. PATENT DOCUMENTS

| | | | | |
|---|---|---|---|---|
| 10,123,418 | B1 | 11/2018 | Lin et al. | |
| 2010/0164669 | A1* | 7/2010 | Soendker | H01G 4/33 336/200 |
| 2011/0080247 | A1* | 4/2011 | Horiuchi | H01F 41/041 336/221 |
| 2012/0212919 | A1 | 8/2012 | Mano et al. | |
| 2017/0278608 | A1 | 9/2017 | Kusunoki et al. | |
| 2022/0406882 | A1* | 12/2022 | Kim | H10D 1/20 |

FOREIGN PATENT DOCUMENTS

| | | | | |
|---|---|---|---|---|
| EP | 3799084 | A1 * | 3/2021 | H01F 41/0206 |
| TW | I496519 | | 8/2015 | |
| TW | 2018 20949 | A | 6/2018 | |
| TW | I678952 | | 12/2019 | |

* cited by examiner 10A
50
41
50
41
50
10
10B
50
50
50
FIG. 6H
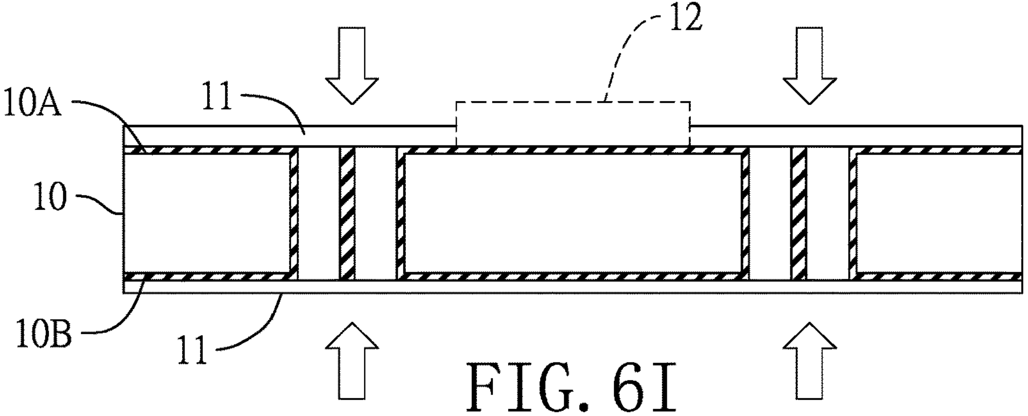
FIG. 6I
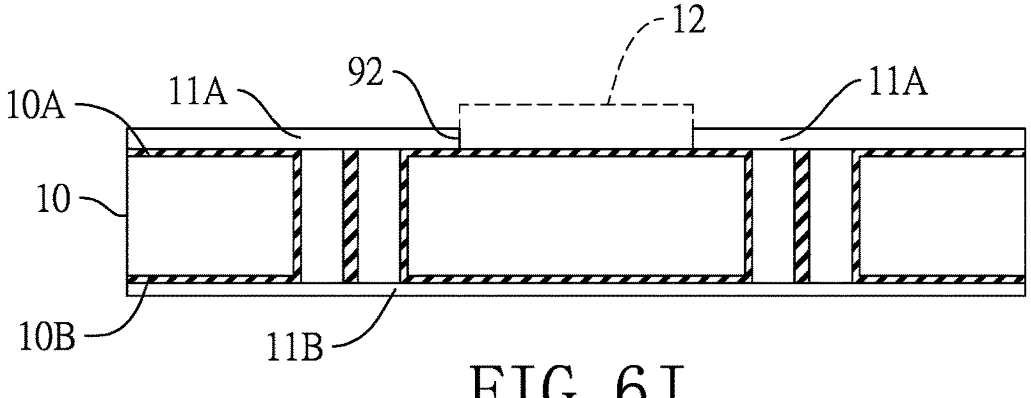
FIG. 6J
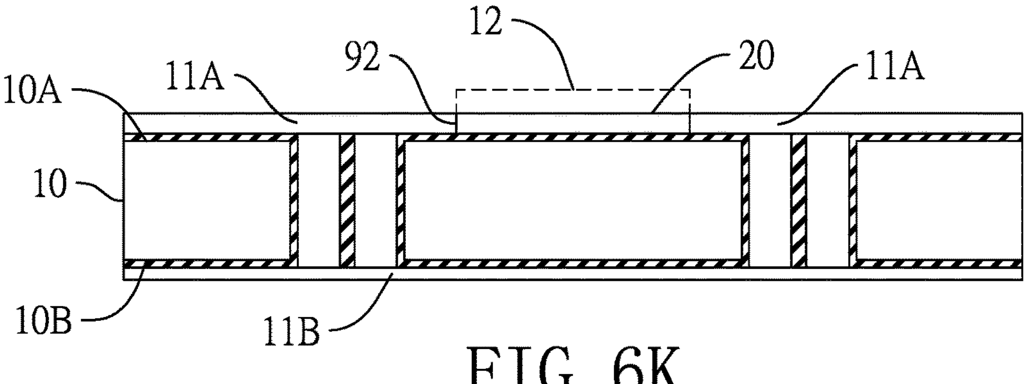
FIG. 6K

EMBEDDED INDUCTOR STRUCTURE AND MANUFACTURING METHOD THEREOF

CROSS-REFERENCE TO RELATED APPLICATION(S)

This application claims the priority benefit of TW application serial No. 112109398 filed on Mar. 14, 2023, the entirety of which is hereby incorporated by reference herein and made a part of the specification.

BACKGROUND OF THE INVENTION

1. Field of the Invention

The present invention relates to an inductor structure and a manufacturing method thereof, and more particularly an embedded inductor structure and a manufacturing method thereof.

2. Description of the Related Art

An inductor includes a coil that encircles an axis multiple times. When electric current changes, the coil produces an electromotive force (EMF) according to a Lorentz force to oppose electric current changes. A strength of this EMF is related to a change of magnetic flux within a unit of time. Thus, an inductance is defined as a ratio between an amount of the magnetic flux and the electric current produced as a result of the said amount of the magnetic flux. In other words, an inductor converts electromagnetic energy of the electric current passing through the coil into a magnetic field generated by the coil. When electric current changes, the EMF produced by the coil would try to sustain the magnetic field and thus keep the magnetic field and the magnetic flux unchanged. The electromagnetic energy stored by the magnetic field is therefore a resistance to the electric current change in the coil.

If a change in the electric current is constant, then the inductance of the inductor is defined by how many times the coil encircles the axis. In other words, the more the coil encircles, the more magnetic flux can be produced by the electric current passing through the coil, and thus generates greater magnetic field strength to oppose the electric current change in the coil. Therefore, a good inductor should have the coil encircling the axis many times.

With reference to FIGS. 7 and 8, a conventional embedded inductor may be distinguished as a conventional horizontal plane inductor 100 or a conventional vertical standing inductor 200. With reference to FIG. 7, the conventional horizontal plane inductor 100 is mounted on a surface of a board 205, without having to penetrate through the board 205, or only merely requiring one to two holes to connect a top level and a bottom level of the conventional horizontal plane inductor 100. As such, the conventional horizontal plane inductor 100 can be easily manufactured. However, a coil 110 of the conventional horizontal plane inductor 100 faces many limitations to be implemented on a limited space of the surface. More particularly, the coil 110 of the conventional horizontal plane inductor 100 is less capable of wrapping around an axis many times than a coil of the conventional vertical standing inductor 200.

With reference to FIG. 8, the conventional vertical standing inductor 200 includes an electromagnetic core 210 and a coil 220 wrapping around the electromagnetic core 210. Though the conventional vertical standing inductor 200 requires a more complicated manufacturing method to create the coil 220 that repeatedly penetrates through the board 205 through multiple conductive vias for wrapping around the electromagnetic core 210, the conventional vertical standing inductor 200 is unlimited by the limited space of the surface of the board 205, and thus the coil 220 of the conventional vertical standing inductor 200 is more capable of wrapping around the electromagnetic core 210 repeatedly. As such, the conventional vertical standing inductor 200 is more ideal as a conventional embedded inductor than the conventional horizontal plane inductor 100.

However, the coil 220 of the conventional vertical standing inductor 200 is still limited by a factor for wrapping around the electromagnetic core 210. Under a limited length of the electromagnetic core 210, an amount of times the coil 220 of the conventional vertical standing inductor 200 is able to wrap around the electromagnetic core 210 is inversely proportional to a via size of each of the conductive vias. In other words, the bigger the via size of each of the conductive vias, the less of the conductive vias are able to fit along the limited length of the electromagnetic core 210. As a result, with less density of the conductive vias along the limited length of the electromagnetic core 210, the coil 220 is less capable of wrapping around the electromagnetic core 210. The formation of the conductive vias is currently limited by an art of mechanical drilling or laser drilling, and thus the via size of each of the conductive vias is at least greater than 20 micrometers (um). The via size of each of the conductive vias on the conventional vertical standing inductor 200 limits the coil 220's ability to densely wrap around the electromagnetic core 210, and thus also limits the inductance of the conventional vertical standing inductor 200.

SUMMARY OF THE INVENTION

To overcome the aforementioned problems, the present invention provides an embedded inductor structure and a manufacturing method thereof. The present invention is able to decrease a via size of each conductive via of a vertical standing inductor, hence increasing a density of the conductive vias formed on a board. This way, the present invention is able to increase an amount of times the coil wraps around an electromagnetic core, and thus improve an inductance of an inductor.

An embedded inductor structure of the present invention includes an aluminum board, an electromagnet core, and a coil.

The aluminum board has a first surface, a second surface opposite to the first surface, and multiple through vias in communication with the first surface and the second surface.

The electromagnet core is mounted on the first surface of the aluminum board. The through vias are located on two opposite sides of the electromagnet core.

The coil is mounted through the through vias to wrap around the electromagnet core. An inside wall of each of the through vias forms an anodic aluminum oxide (AAO) formed by an anodizing process.

The AAO is an insulator, and therefore the AAO is able to prevent the coil from being electrically connected to the aluminum board. The through vias created by the anodizing process each respectively have a via size of 0.01 to 1 micrometer (um), far less than a via size of 20 um. As such, the present invention is able to massively decrease the via size of the through vias, and hence greatly improve the density of the through vias formed beside the electromagnet core, increase the amount of times the coil wraps around the electromagnet core, and improve the inductance of the embedded inductor structure.

In an embodiment of the present invention, the embedded inductor structure further includes a first dielectric layer and a second dielectric layer. The first dielectric layer is mounted on the first surface of the aluminum board, and the first dielectric layer covers the electromagnet core. The second dielectric layer is mounted on the second surface of the aluminum board. The through vias penetrate through the first dielectric layer and the second dielectric layer, and the coil wraps around the electromagnet core and parts of the first dielectric layer and the second dielectric layer.

Furthermore, the first surface and the second surface of the aluminum board respectively form an anodic aluminum oxide layer. The electromagnet core is mounted on the anodic aluminum oxide layer on the first surface. The anodic aluminum oxide layer on the first surface, the anodic aluminum oxide layer on the second surface, and the AAO formed inside the through vias completely covers the aluminum board. Each of the through vias contains at least one sub-through via, and the at least one sub-through via is at least one hexagonal sub-through via. In another embodiment, each of the through vias is a hexagonal through via.

A manufacturing method of the embedded inductor structure of the present invention includes the following steps:

- step S10: preparing an aluminum board; wherein the aluminum board has a first surface and a second surface opposite to the first surface;
- step S20: forming a first mask layer and a second mask layer respectively on the first surface and the second surface; wherein the first mask layer and the second mask layer are patterned, and multiple lithographic openings are formed on the first mask layer; wherein the lithographic openings are distributed on two opposite sides of an electromagnet area located on the first surface;
- step S30: conducting an anodizing process to the aluminum board exposed by the lithographic openings for forming multiple blind vias in the lithographic openings;
- step S40: removing the second mask layer, and planarizing the second surface of the aluminum board for removing bottom surfaces of the blind vias and forming multiple through vias; wherein an inside wall of each of the through vias forms an anodic aluminum oxide (AAO) formed by the anodizing process;
- step S50: mounting an electromagnet core in the electromagnet area on the first surface of the aluminum board;
- step S60: forming a coil; wherein the coil passes through the through vias for wrapping around the electromagnet core.

The embedded inductor structure made by the said manufacturing method, as previously mentioned, is able to massively decrease the via size of the through vias through conducting the anodizing process, and hence greatly improve the inductance of the embedded inductor structure. Furthermore, a conventional manufacturing method of a conventional vertical standing inductor often uses a copper clad laminated board (CCL). The CCL includes an insulator board and copper clads laminated on two opposite surfaces on the insulator board. The conventional manufacturing method, before all else, requires first etching away the copper clads of the CCL before continuing manufacturing steps. However, the manufacturing method of the present invention directly makes use of the conductive aluminum board, and through conducting the anodizing process, the present invention forms the insulating AAO to prevent an electrical connection between the coil and the aluminum board. As such, the present invention uses a completely different manufacturing method for manufacturing the embedded inductor structure.

In an embodiment of the present invention, step S50 forms the electromagnet core by lithographically patterning the first surface of the aluminum board, and depositing a magnetic material of a pure metal or a metal alloy for forming the electromagnet core. Step S60 further includes a sub-step of forming a metallic seed layer on the first surface, the second surface, and the through vias, and another sub-step of electroplating the metallic seed layer for forming the coil.

In an embodiment of the present invention, between step S40 and step S50, the manufacturing method further includes a step of conducting the anodizing process to the first surface and the second surface of the aluminum board for respectively forming an anodic aluminum oxide layer. Between step S50 and step S60, the manufacturing method further includes a step of forming a first dielectric layer and a second dielectric layer respectively on the first surface and the second surface of the aluminum board. The first dielectric layer and the second dielectric layer are patterned. The first dielectric layer covers the electromagnet core and exposes the through vias, and the second dielectric layer exposes the through vias. Each of the blind vias formed by step S30 is respectively a hexagonal blind via. In another embodiment, each of the blind vias formed by step S30 contains at least one sub-blind via, and the at least one sub-blind via is at least one hexagonal sub-blind via.

DETAILED DESCRIPTION OF THE INVENTION

The present invention provides an embedded inductor structure and a manufacturing method thereof.

Figure 1:
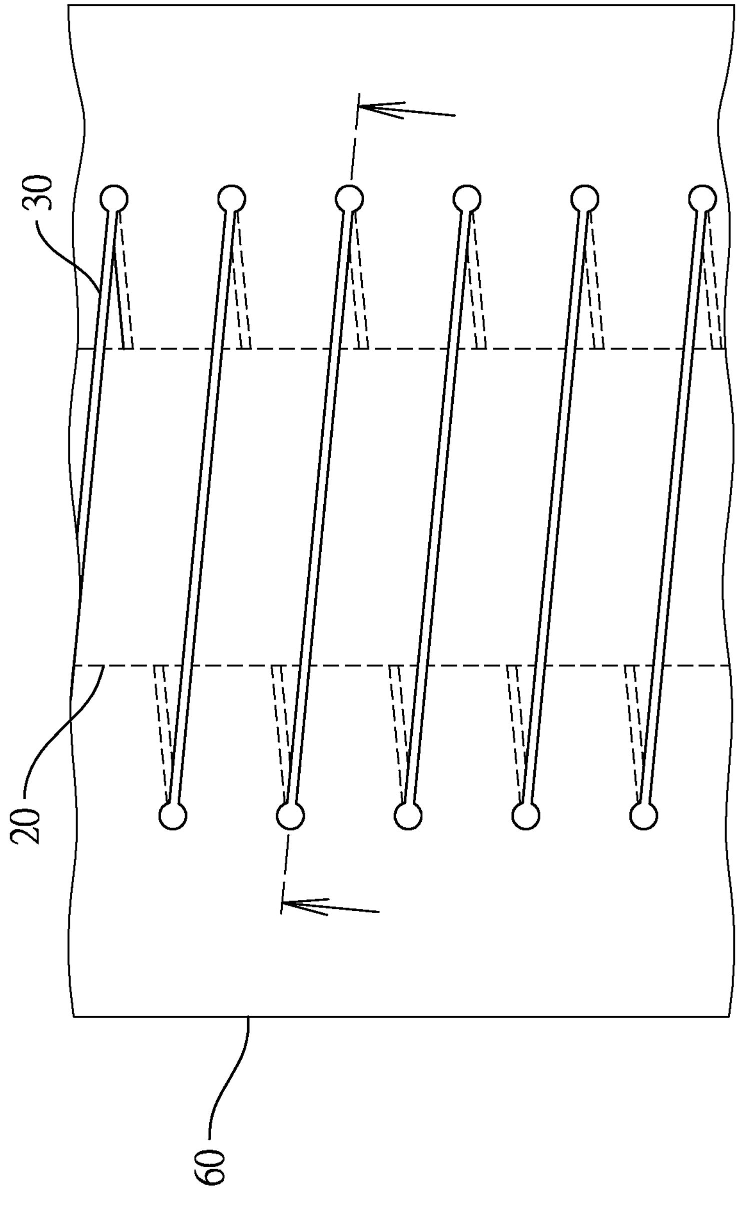
FIG. 1 is a perspective view of an embedded inductor structure of the present invention.
Figure 2:
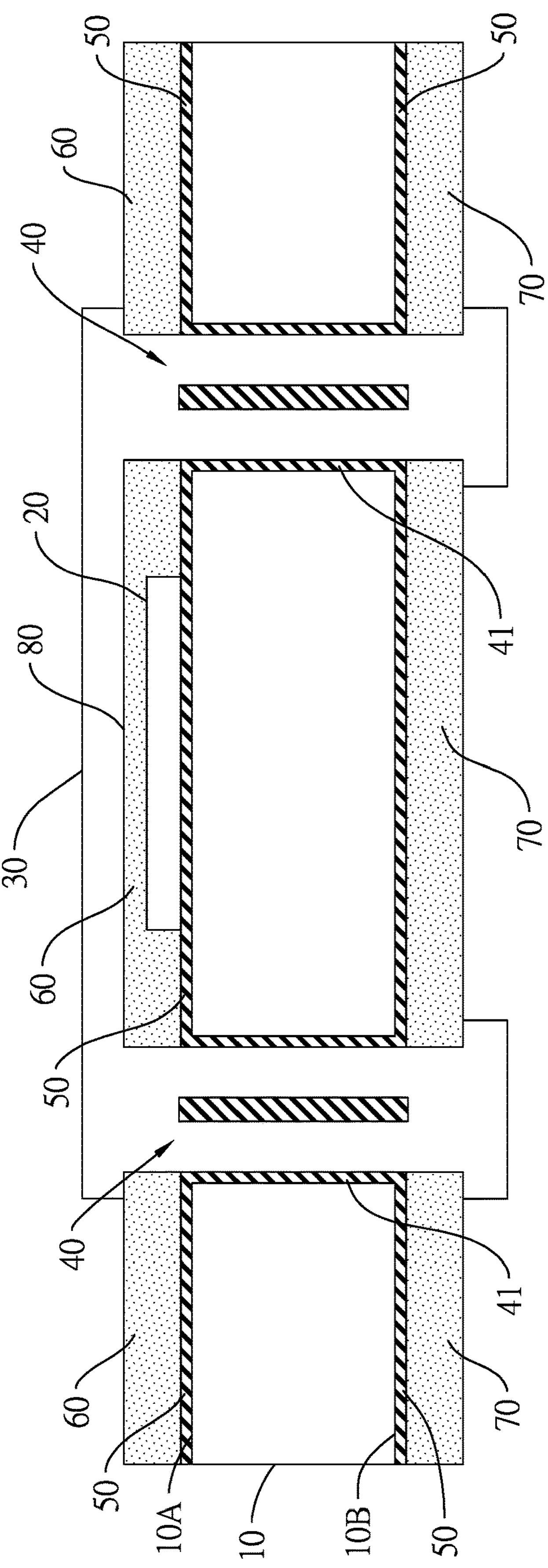
FIG. 2 is a cross-sectional perspective view of a first embodiment of the embedded inductor structure of the present invention.

With reference to FIGS. 1 and 2, the embedded inductor structure of the present invention includes an aluminum board 10, an electromagnet core 20, and a coil 30.

The aluminum board 10 has a first surface 10A and a second surface 10B opposite to the first surface. The aluminum board 10 further includes multiple through vias 40 in communication with the first surface 10A and the second surface 10B. The electromagnet core 20 is mounted on the first surface 10A of the aluminum board 10. The through vias 40 are located on two opposite sides of the electromagnet core 20. The coil 30 is mounted through the through vias 40 to wrap around the electromagnet core 20. An inside wall 41 of each of the through vias 40 forms an anodic aluminum oxide (AAO) formed by an anodizing process.

The anodizing process is a known and mature art. The anodizing process is able to polarize and oxidize aluminum metal for forming the AAO in the shape of hexagonal honeycombs. The AAO is an insulator, and each cell of the honeycomb structure within the AAO is hollow. Furthermore, the AAO formed by the anodizing process creates openings of 0.01 micrometer (um) to 1 um wide for the cells of the honeycomb structure. In other words, each of the openings for each of the cells of the honeycomb structure is about 10 nanometers (nm) to 1000 nm wide. The said widths for the openings, in fact, can be adjusted by configuring manufacturing variables of the anodizing process. The present invention freely allows the manufacturing variables of the anodizing process to be changed. The manufacturing variables of the anodizing process, for example, include a voltage value used for the anodizing process, a current density used for the anodizing process, an acidity (pH) value used for the anodizing process, a type of an electrolyte solution used for the anodizing process, a concentration of the electrolyte solution used for the anodizing process, a temperature of the electrolyte solution used for the anodizing process, and a time length conducting the anodizing process, etc. For instance, by conducting the anodizing process with longer time length and with higher concentration of the electrolyte solution, the aluminum metal is anodized faster for forming the AAO, for forming the honeycomb structure, and also for deepening depths of the cells of the honeycomb structure. Since the anodizing process is an art already made public by numerous publications, the present invention will omit detailing technical specifications used for generation of the AAO.

The AAO generated by the present invention is able to cover the aluminum board 10. This prevents an electrical connection between the coil 30 and the aluminum board 10, and thus guarantees the inductor for functioning. As mentioned before about the widths of the cells of the honeycomb structure, each of the through vias 40 has an opening width of 0.01 micrometer (um) to 1 um. Since such opening width is far less than 20 um, the present invention is able to greatly reduce the opening widths of the through vias 40. This allows a great increase in a density of the through vias 40 formed beside the electromagnet core 20 on the aluminum board 10, and thus further allows an increase in an amount of times the coil 30 is able to wrap around the electromagnet core 20. As a result, the present invention is able to increase and improve an inductance of the embedded inductor structure.

Please be reminded that FIG. 2 is a cross-sectional view of FIG. 1 along a direction specified to be dicing along the coil 30. In other words, the coil 30 actually spans both the first surface 10A and the second surface 10B of the aluminum board 10, however the cross-sectional view presented in FIG. 2 would only depict a portion of the coil 30 distributed on the first surface 10A.

In a first embodiment of the present invention, the embedded inductor structure further includes an anodic aluminum oxide (AAO) layer 50, a first dielectric layer 60, and a second dielectric layer 60.

The AAO layer 50 respectively covers the first surface 10A and the second surface 10B of the aluminum board 10. In other words, the first surface 10A and the second surface 10B of the aluminum board 10 both go through the anodizing process in a short amount of time, allowing the respective formation of the AAO layer 50 on the first surface 10A and the AAO layer 50 on the second surface 10B. As such, the aluminum board 10 is completely covered by the material of anodic aluminum oxide (AAO). In other words, not only the first surface 10A and the second surface 10B of the aluminum board 10 are covered by the respective AAO layers 50, but also the through vias 40 of the aluminum board 10 are covered by AAO. The material of AAO is analogous to an insulation protection layer for the aluminum board 10.

The electromagnet core 20 is mounted on the AAO layers 50 on the first surface 10A. The first dielectric layer 60 is mounted on the first surface 10A of the aluminum board 10, and the first dielectric layer 60 covers the electromagnet core 20 and the AAO layer 50 on the first surface 10A. The electromagnet core 20 is made from a magnetic material of a pure metal or a metal alloy. The second dielectric layer 70 is mounted on the second surface 10B of the aluminum board 10, and the second dielectric layer 70 covers the AAO layer 50 on the second surface 10B. The through vias 40 penetrate through the first dielectric layer 60 and the second dielectric layer 70. The coil 30 wraps around the electromagnet core 20 and parts of the first dielectric layer 60 and the second dielectric layer 70.

Figure 3:
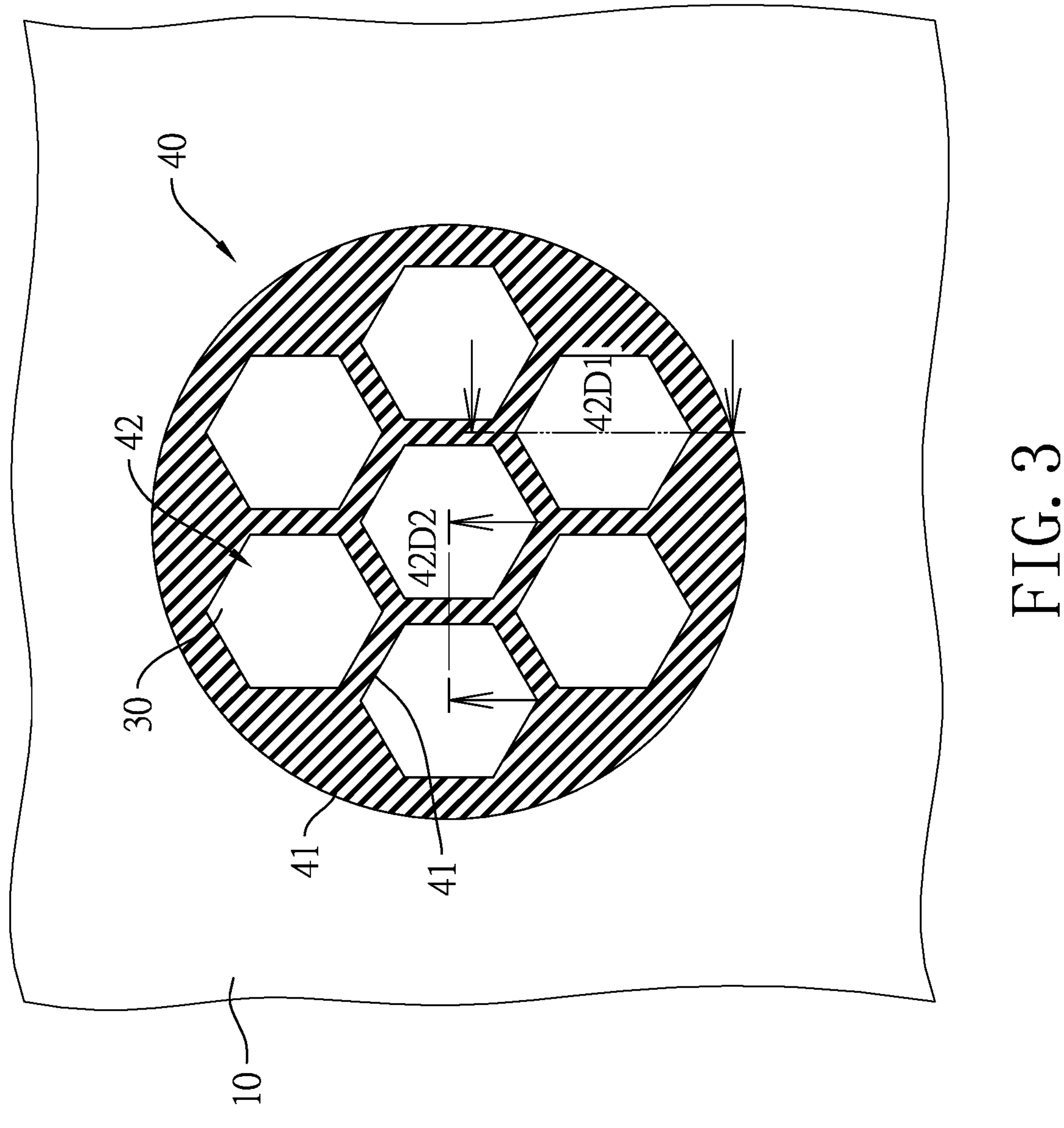
FIG. 3 is another cross-sectional perspective view of the first embodiment of the embedded inductor structure of the present invention.

With reference to FIG. 3, in the first embodiment, each of the through vias 40 contains multiple sub-through vias 42. The sub-through vias 42, as previously mentioned, are hexagonal sub-through vias with cells in the shape of honeycombs. The inside walls 41 of the through vias 40 are also the inside walls 41 separating each of the sub-through vias 42. In the example presented in FIG. 3, each of the through vias 40 contains seven of the sub-through vias 42. Each of the sub-through vias 42 is identical, and each of the sub-through vias 42 has a maximum opening width 42D1 and a separation distance 42D2 of two of the adjacent sub-through vias 42. According to trigonometry, a relation between the maximum opening width 42D1 and the separation distance 42D2 is as follows:

$$\text{the separation distance}=(\text{the maximum opening width})*\sqrt{3}/2$$

Figure 4:
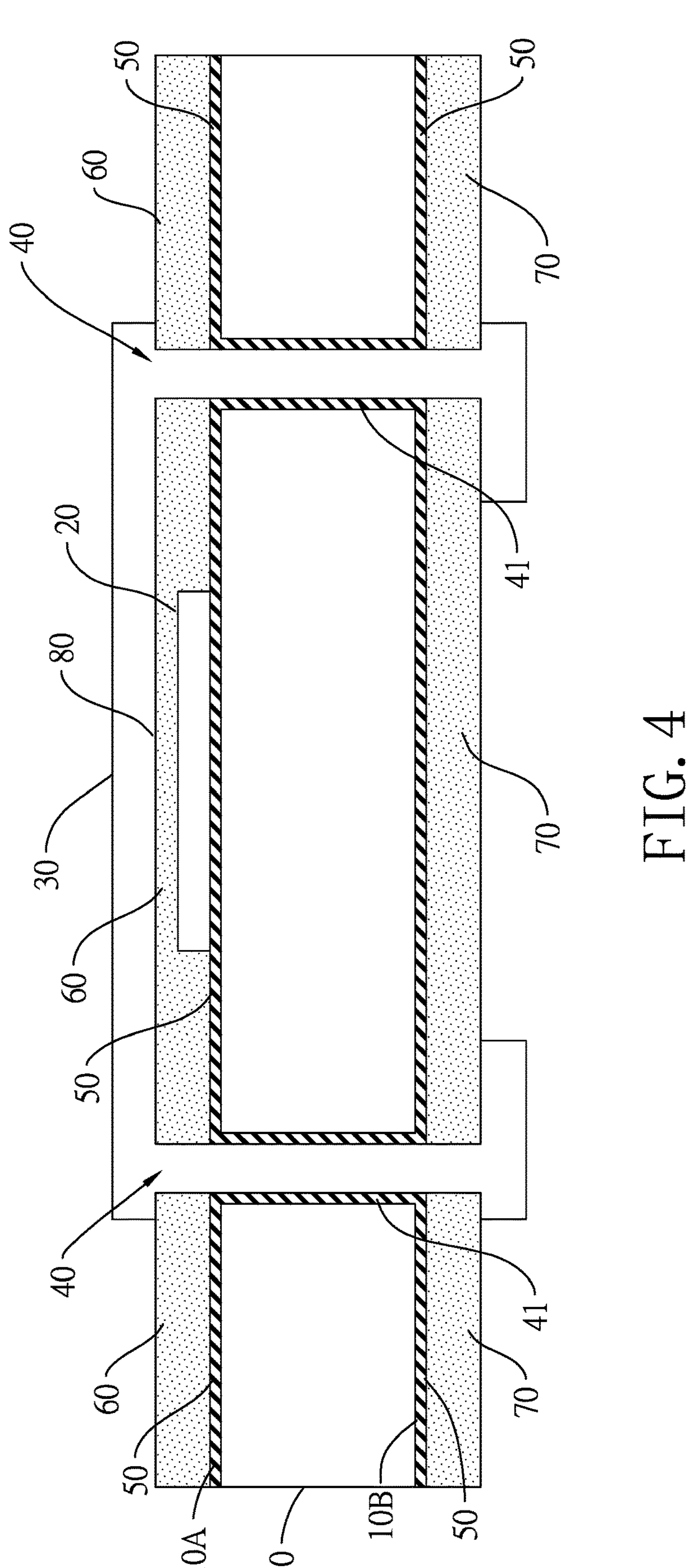
FIG. 4 is a cross-sectional perspective view of a second embodiment of the embedded inductor structure of the present invention.
Figure 5:
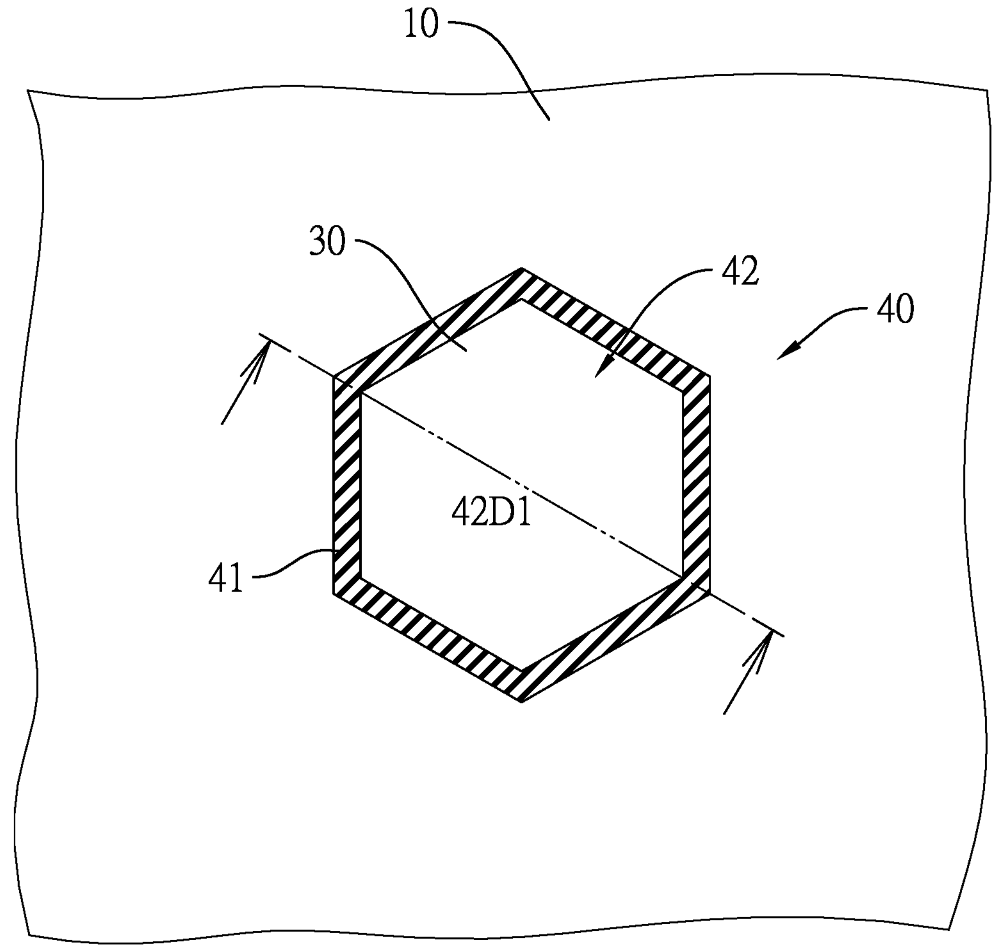
FIG. 5 is another cross-sectional perspective view of the second embodiment of the embedded inductor structure of the present invention.

With reference to FIGS. 4 and 5, in a second embodiment of the embedded inductor structure of the present invention, each of the through vias 40 contains only one sub-through via 42. In other words, each of the through vias 40 is a hexagonal through via with a hexagonal opening. In this embodiment, the coil 30 wrapping around the electromagnet core 20 through the through vias 40 is able to maintain a consistent conductive channel width. In other words, the conductive channel width of the coil 30 avoids needing to narrow down in order to fit between the inside walls 41 of the honeycomb structure and fit through the through vias 40. With reference to FIG. 5, the conductive channel width of the coil 30 therefore equals to the maximum opening width 42D1.

Figure 6A:
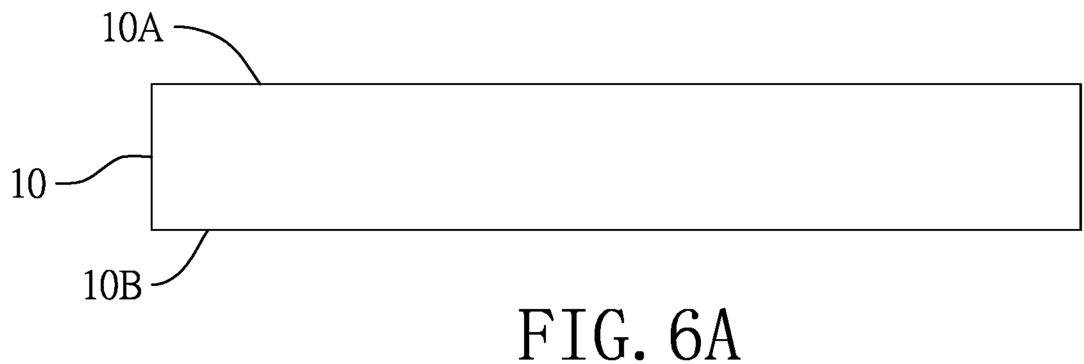
FIGS. 6A to 6R are flow charts of a manufacturing method for the first embodiment of the embedded inductor structure of the present invention.
Figure 6B:
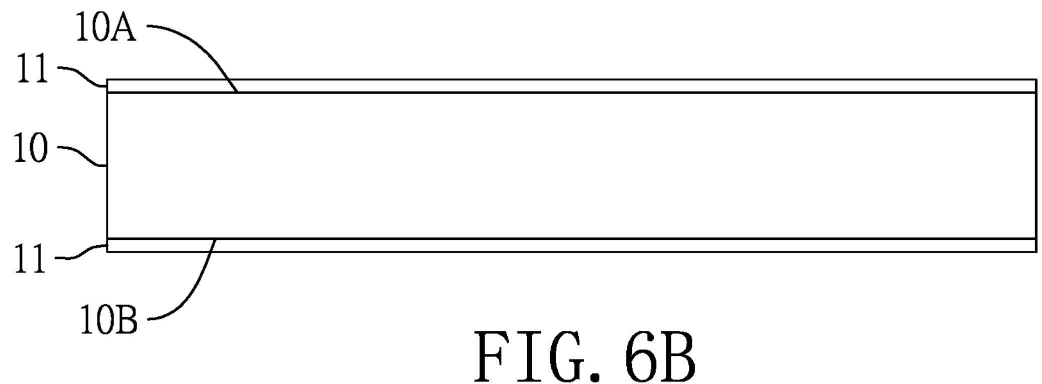
Figure 6C:
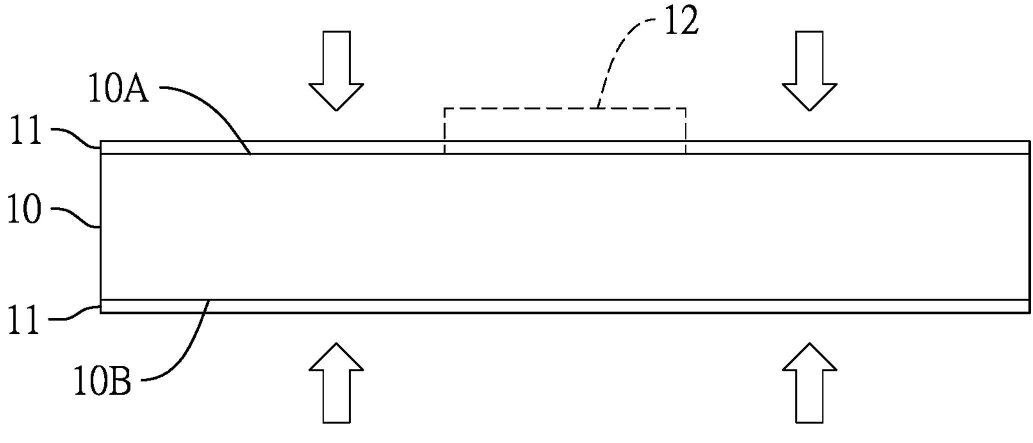
Figures 6D, 6E, 6F, 6G:
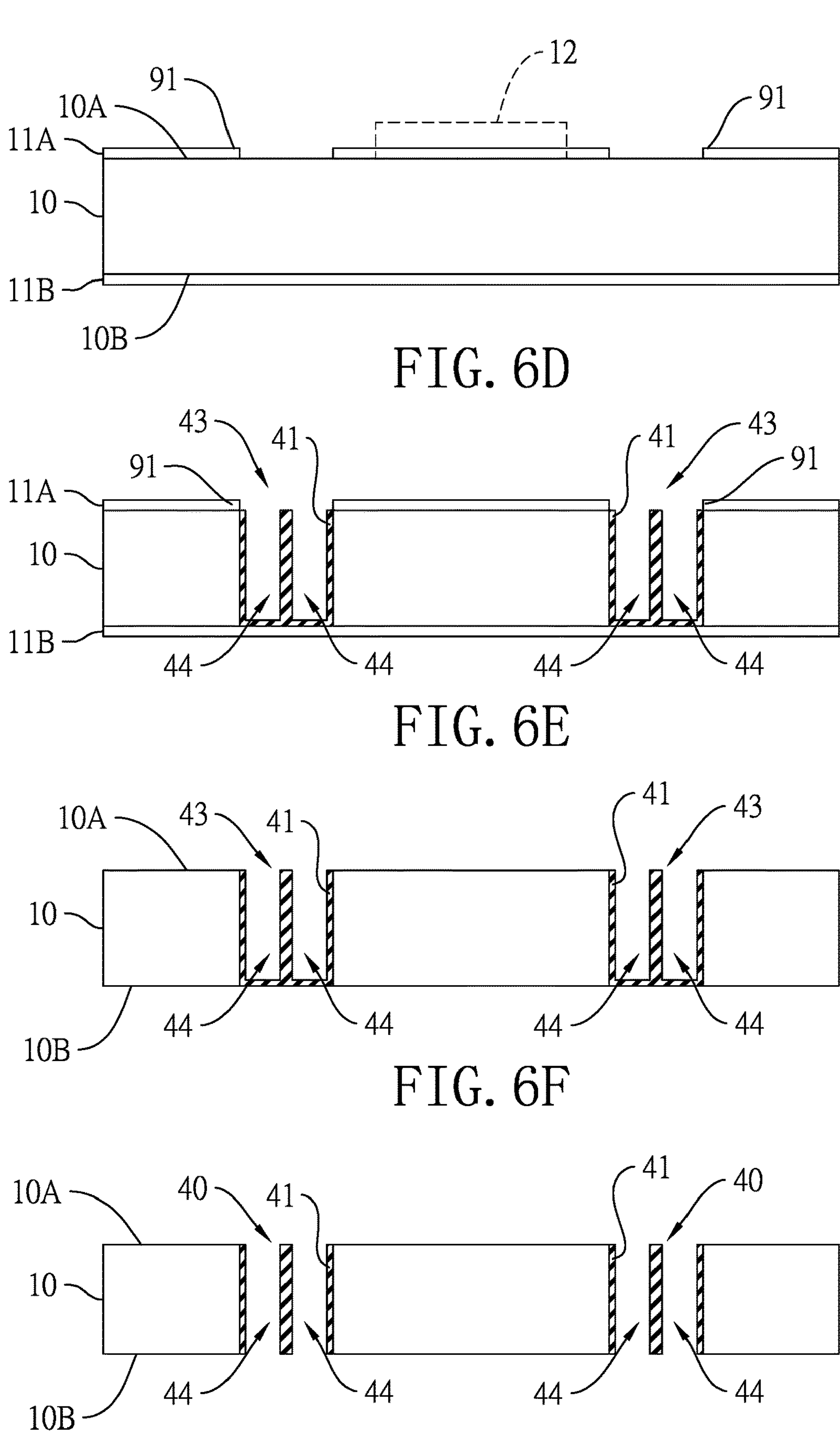
Figure 6L:
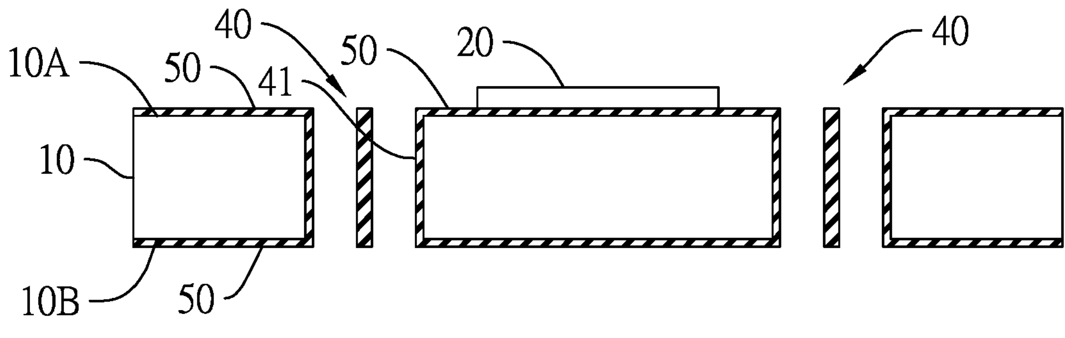
Figure 6M:
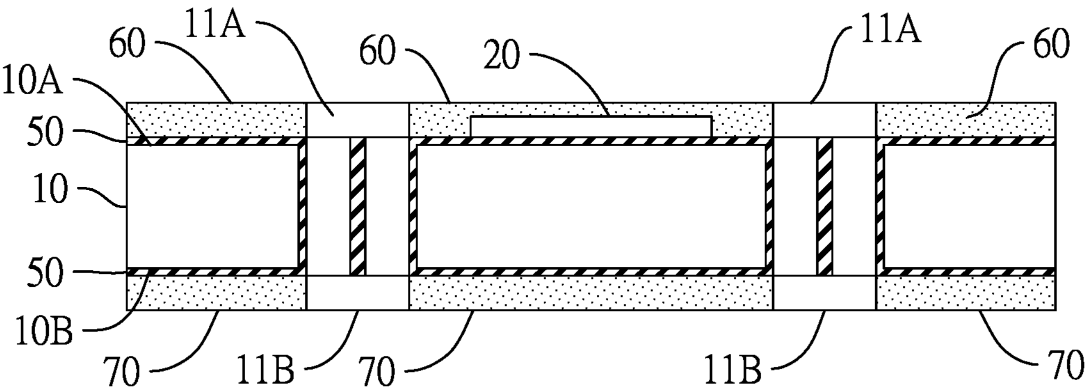
Figure 6N:
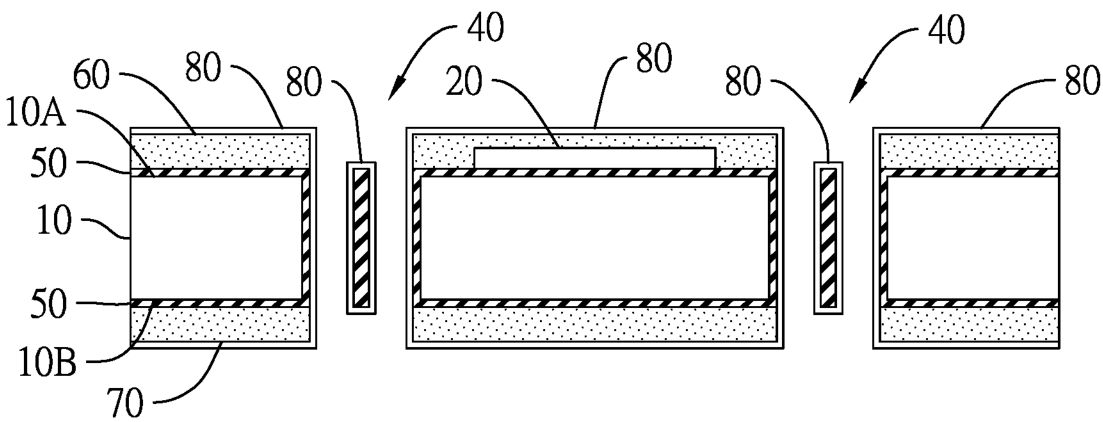
Figure 6O:
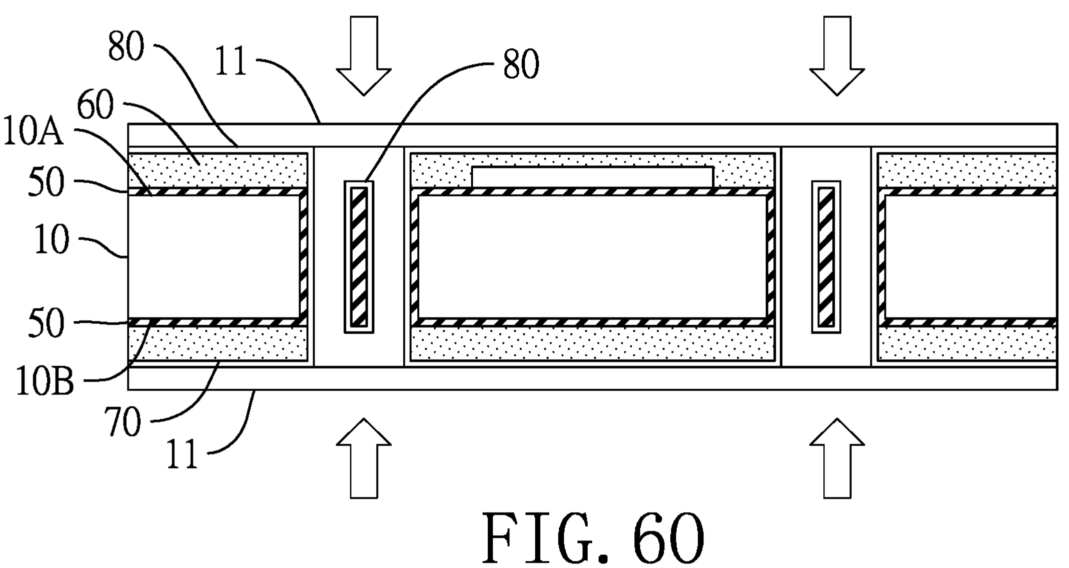
Figure 6P:
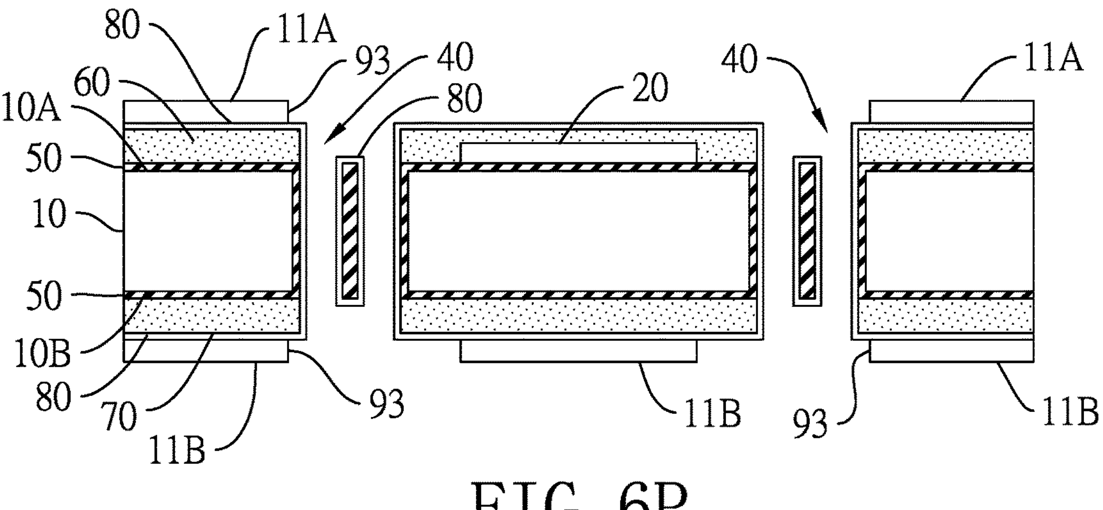
Figure 6Q:
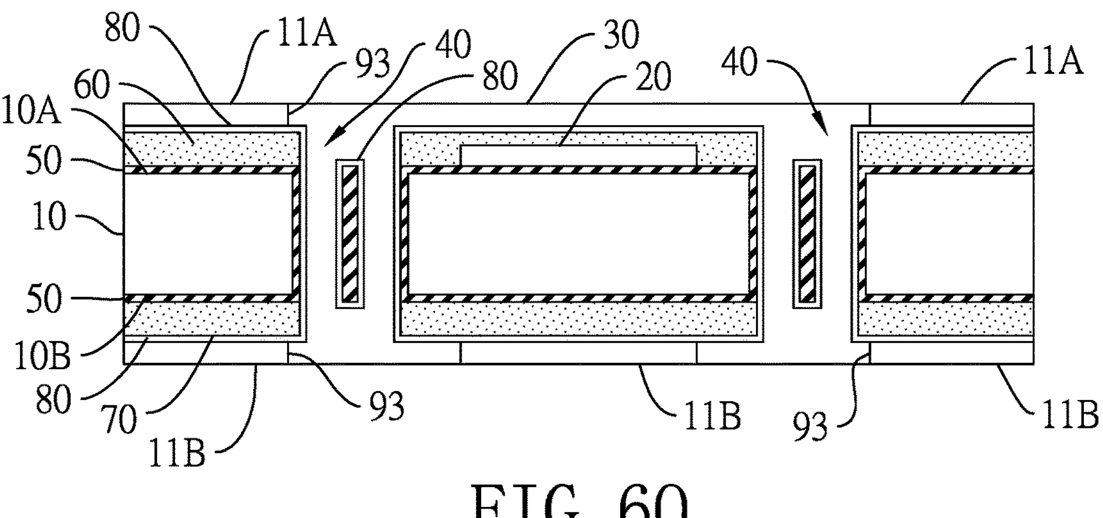
Figure 6R:
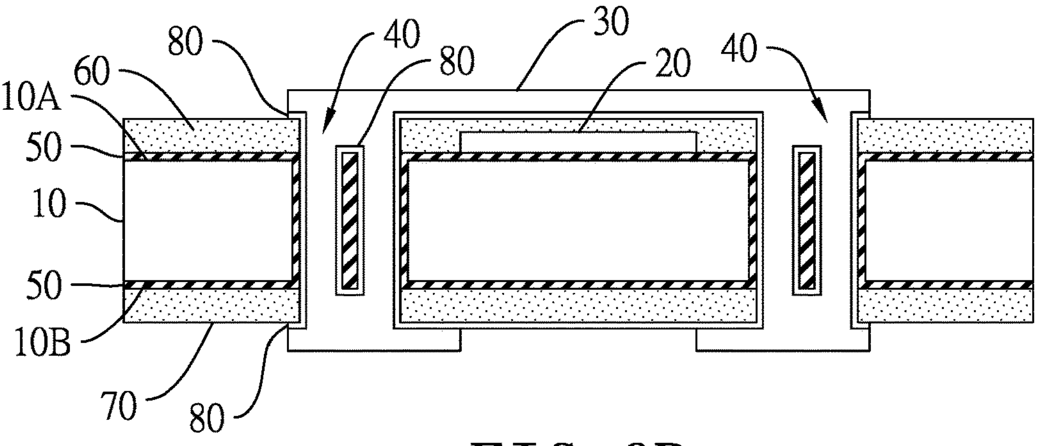
Figure 7:
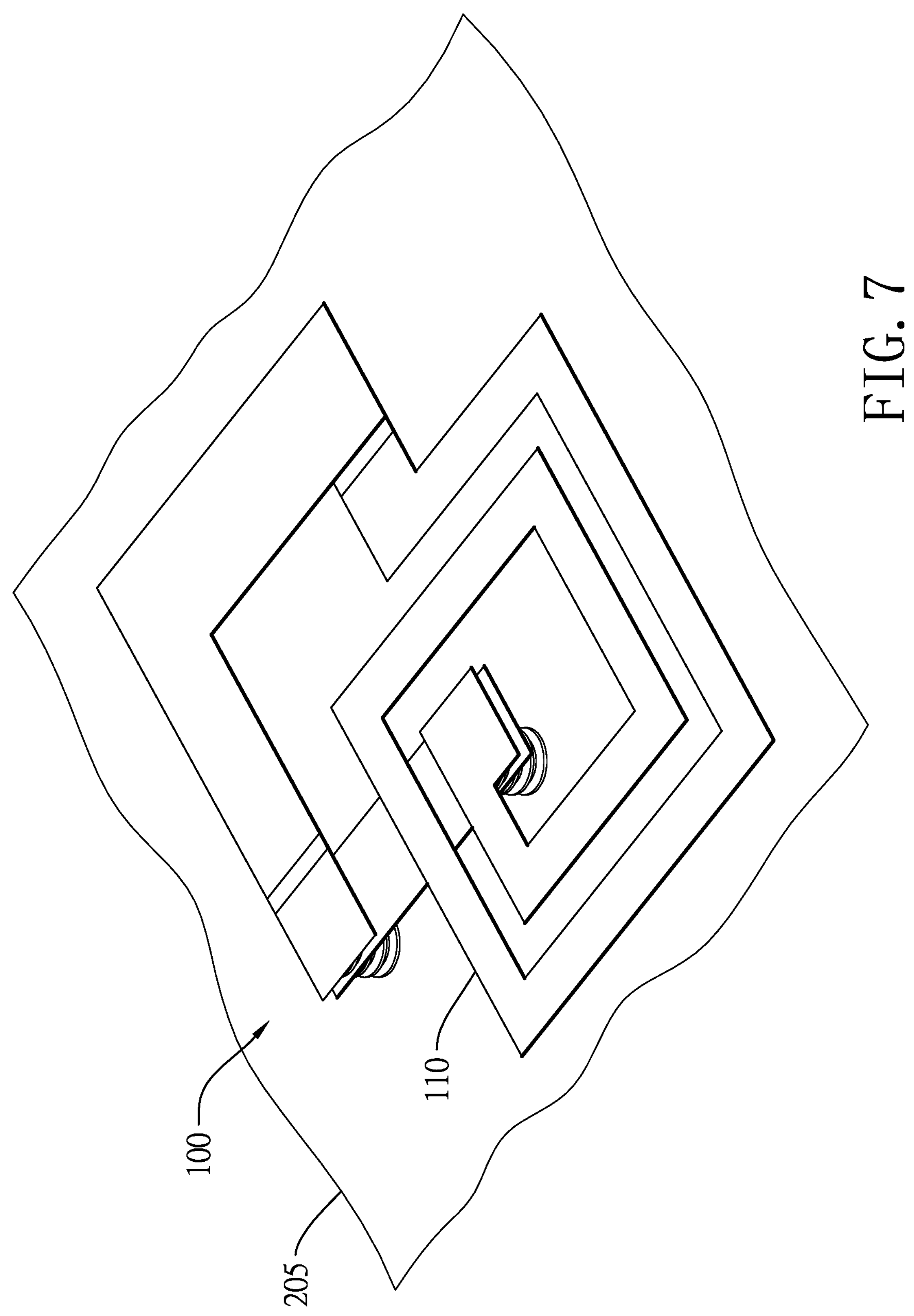
FIG. 7 is a perspective view of a conventional horizontal plane inductor.
Figure 8:
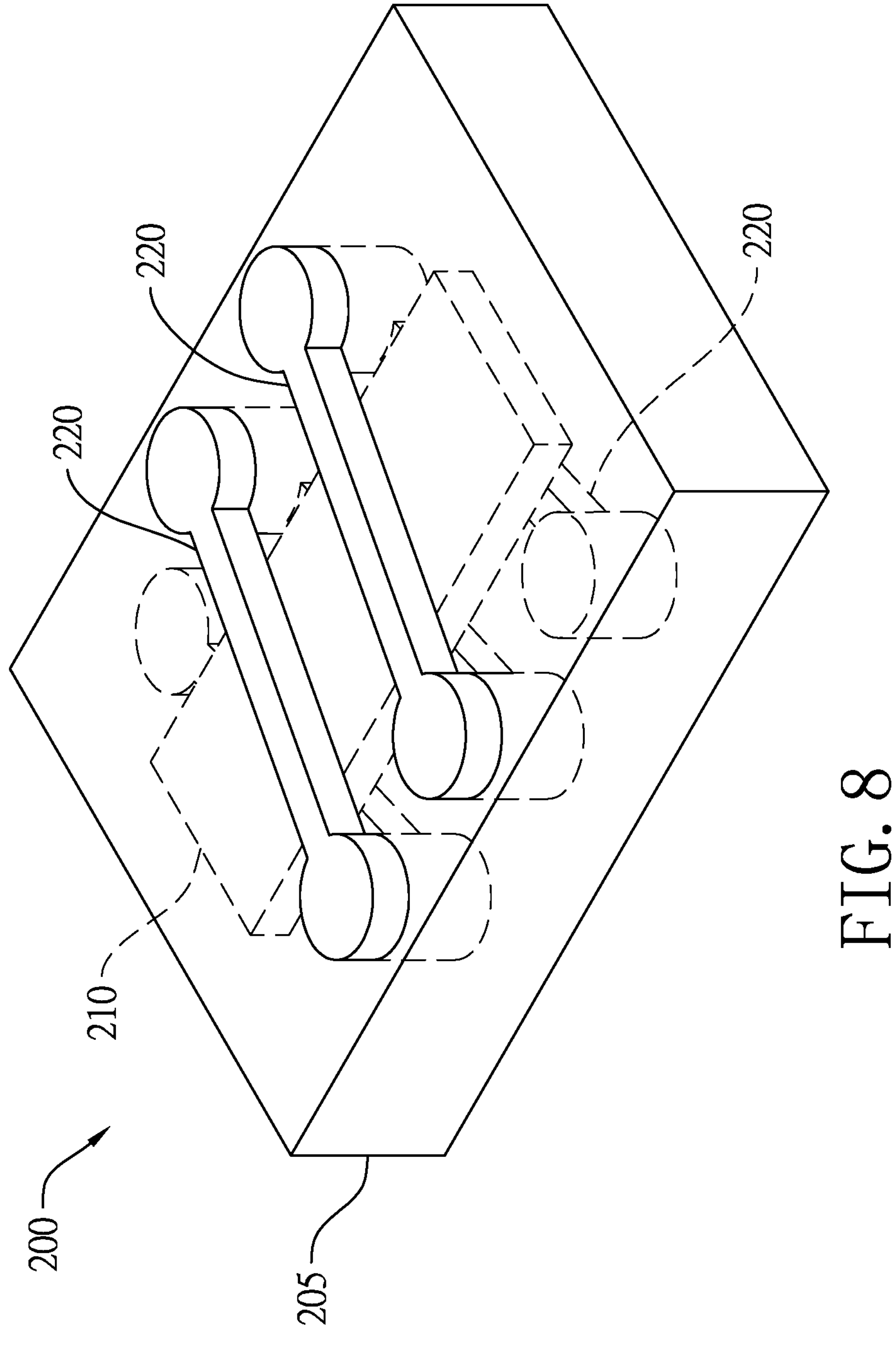
FIG. 8 is a perspective view of a conventional vertical standing inductor.

A manufacturing method of the embedded inductor structure in the first embodiment of the present invention includes the following steps described through FIGS. 6A to 6R. Please be reminded that FIGS. 6A to 6R are also flowcharts describing cross-sectional perspective views of the embedded inductor structure along the dicing direction specified in FIG. 2. In other words, the embedded inductor structure completed through the manufacturing method would include the coil 30 spanning both the first surface 10A and the second surface 10B of the aluminum board 10, however the cross-sectional view presented in FIGS. 6A to 6R along the dicing direction specified in FIG. 2 would only depict a portion of the coil 30 distributed on the first surface 10A.

With reference to FIG. 6A, prepare an aluminum board 10. The aluminum board 10 has a first surface 10A and a second surface 10B opposite to the first surface 10A.

With reference to FIG. 6B, deposit a photoresist layer 11 respectively on the first surface 10A and the second surface 10B of the aluminum board 10.

With reference to FIGS. 6C and 6D, expose and develop the photoresist layers 11 on the first surface 10A and the second surface 10B of the aluminum board 10 for creating patterns, thus forming a first mask layer 11A on the first surface 10A of the aluminum board 10 and a second mask layer 11B on the second surface 10B of the aluminum board 10. Multiple first lithographic openings 91 are formed on the first mask layer 11A on the first surface 10A. The first lithographic openings 91 are distributed on two opposite sides of an electromagnet area 12 located on the first surface 10A. In the present embodiment, the first lithographic openings 91 are distributed as two equally spaced straight arrays on the first surface 10A. The manufacturing steps described in FIGS. 6B to 6D are conventional lithographic steps.

With reference to FIG. 6E, conduct an anodizing process to the aluminum board 10 exposed by the first lithographic openings 91 for forming multiple blind vias 43 in the first lithographic openings 91. An inside wall 41 of each of the blind vias 43 forms an anodic aluminum oxide (AAO) formed by the anodizing process. A bottom surface of each of the blind vias 43 also forms the AAO. Furthermore, each of the blind vias 43 formed from this step also contains at least one sub-blind via 44, and the at least one sub-blind via 44 is at least one hexagonal sub-blind via. In another embodiment, each of the blind vias 43 formed from this step is a hexagonal blind via.

With reference to FIG. 6F, remove the first mask layer 11A on the first surface 10A and the second mask layer 11B on the second surface 10B.

With reference to FIG. 6G, planarize the second surface 10B of the aluminum board 10 for removing bottom surfaces of the blind vias 43, thus forming multiple through vias 40. As a result, the inside wall 41 of each of the through vias 40 is the same AAO as the inside wall 41 of each of the blind vias 43. In other words, this step allows the inside wall 41 of each of the through vias 40 to be the AAO formed by the anodizing process. In the present embodiment, the planarization of the bottom surfaces of the blind vias 43 is done through chemical mechanical polishing (CMP) the second surface 10B of the aluminum board 10. As the bottom surfaces of the blind vias 43 are removed, the blind vias 43 turn into the through vias 40. In other embodiments, the planarization may also be done through other means to grind away the second surface 10B. Furthermore, when the second surface 10B is grinded away to remove the bottom surfaces of the blind vias 43, the at least one sub-blind via 44 is turned into the at least one sub-through via 42, and the inside wall 41 of each of the through vias 40 is also the inside wall 41 separating each of the sub-through vias 42. In other words, in this step of this embodiment, the hexagonal at least one sub-blind via 44 is turned into the hexagonal at least one sub-through via 42. In another embodiment, this step turns the hexagonal blind vias 43 into the hexagonal through vias 40. After executing this step, the through vias 40 are formed on the first surface 10A and on the second surface 10B of the aluminum board 10 respectively in vertically corresponding positions. The first surface 10A of the aluminum board 10 has two arrays of the through vias 40, and the second surface 10B of the aluminum board 10 also correspondingly has two arrays of the through vias 40.

With reference to FIG. 6H, form the AAO through conducting another anodizing process. However, the anodizing process is conducted with less reaction time in this step than the step described for FIG. 6E. As such, this step prevents forming new blind vias on the first surface 10A and the second surface 10B. The anodizing process conducted in this step is controlled to only allow formation of an anodic aluminum oxide (AAO) layer 50 respectively on the first surface 10A and the second surface 10B. As a result, the AAO layers 50 are respectively on the first surface 10A and the second surface 10B of the aluminum board 10, and the AAO formed on the inside walls 41 of the aluminum board 10 completely cover the aluminum board 10.

With reference to FIGS. 61 and 6J, deposit the photoresist layer 11 respectively on the first surface 10A and the second surface 10B of the aluminum board 10, and form the first mask layer 11A on the first surface 10A and the second mask layer 11B on the second surface 10B through another round of lithographic steps. The first mask layer 11A on the first surface 10A is patterned by exposure of the lithographic steps, and thus a second lithographic opening 92 is formed on the first mask layer 11A at location corresponding to the electromagnet area 12.

With reference to FIG. 6K, deposit a magnetic material of a pure metal or a metal alloy in the second lithographic opening 92. In other words, the magnetic material is deposited on the AAO layers 50 on the first surface 10A exposed through the second lithographic opening 92 for forming an electromagnet core 20. As such, the electromagnet core 20 is formed in the electromagnet area 12 between two arrays of the through vias 40. The electromagnet core 20 is free to be deposited through any means. In the present embodiment, the electromagnet core 20 is deposited through electroplating.

With reference to FIG. 6L, remove the first mask layer 11A on the first surface 10A and the second mask layer 11B on the second surface 10B.

With reference to FIG. 6M, form dielectric layers on the first surface 10A and the second surface 10B. More particularly, in order to form the dielectric layers, photo-resistive layers are deposited on the first surface 10A and the second surface 10B directly through a lithographic step. Then by exposure and development, the first dielectric layer 60 and the second dielectric layer 70 are patterned. As a result, the through vias 40 are exposed by both the first dielectric layer 60 and the second dielectric layer 70.

With reference to FIG. 6N, through chemical deposition (electroless deposition), vapour deposition, or sputtering, deposit a metallic film of a metallic seed layer 80 on the first surface 10A, the second surface 10B, and inside of the through vias 40. In the present embodiment, the metallic seed layer 80 is deposited through electroless copper deposition on the first surface 10A, the second surface 10B, and inside of the through vias 40. The metallic seed layer 80 made of copper therefore completely covers the first dielectric layer 60, the second dielectric layer 70, and the inside walls 41 of the AAO material in the through vias 40. With reference to FIG. 6N, the through vias 40 penetrate through the first surface 10A and the second surface 10B of the aluminum board 10.

With reference to FIGS. 60 and 6P, deposit the photoresist layer 11 respectively on the first surface 10A and the second surface 10B of the aluminum board 10, and form the first mask layer 11A on the first surface 10A and the second mask layer 11B on the second surface 10B through another round of lithographic steps. The first mask layer 11A on the first surface 10A and the second mask layer 11B on the second surface 10B are patterned by exposure of the lithographic steps, and thus multiple third lithographic openings 93 are formed respectively on the first mask layer 11A and the second mask layer 11B. The third lithographic openings 93 surround the electromagnet core 20. More particularly, the third lithographic openings 93 on the first mask layer 11A are located between the through vias 40. Each of the third lithographic openings 93 on the first surface 10A respectively connects the two arrays of through vias 40 on the first surface 10A in a one-to-one corresponding manner. Furthermore, each of the third lithographic openings 93 on the second surface 10B also respectively connects the two arrays of through vias 40 on the second surface 10B in a one-to-one corresponding manner.

With reference to FIG. 6Q, form a coil 30 in the third lithographic openings 93 on both the first surface 10A and the second surface 10B on the aluminum board 10. More particularly, in the present embodiment, the coil 30 is deposited through electroplating copper onto the metallic seed layer 80 exposed through the third lithographic openings 93. This also includes depositing the coil 30 made of copper onto the metallic seed layer 80 in the through vias 40. The metallic seed layer 80 exposed through the third lithographic openings 93 is deposited with copper, in other words the same type of metal used for the coil 30. After forming the coil 30 in the third lithographic openings 93 patterned on the first surface 10A and the second surface 10B, the coil 30 is formed wrapping around the electromagnet core 20 and passing through the through vias 40.

With reference to FIG. 6R, remove the first mask layer 11A on the first surface 10A and the second mask layer 11B on the second surface 10B, and remove parts of the metallic seed layer 80 covered by the first mask layer 11A and the second mask layer 11B for completing the manufacturing method of the embedded inductor structure. As a result, the manufactured embedded inductor structure has an identical structure as shown in FIG. 1. In the present embodiment, the metallic seed layer 80 covered by the coil 30 and the coil 30 itself share the same metallic material, and hence the coil 30 and parts of the metallic seed layer 80 are represented as a same metallic structure in FIG. 1, for instance, a conductive pathway made of copper metal. When the manufacturing of the embedded inductor structure is complete, the coil 30 wraps around the electromagnet core 20, passes through the through vias 40, and respectively connects the two arrays of the through vias 40 on the first surface 10A in a one-to-one corresponding manner and the two arrays of the through vias 40 on the second surface 10B also in a one-to-one corresponding manner.

What is claimed is:

1. An embedded inductor structure, comprising:

an aluminum board, having a first surface, a second surface opposite to the first surface, and multiple through vias in communication with the first surface and the second surface;

an electromagnet core, mounted on the first surface of the aluminum board;

wherein the through vias are located on two opposite sides of the electromagnet core;

a coil, mounted through the through vias to wrap around the electromagnet core;

wherein an inside wall of each of the through vias forms an anodic aluminum oxide (AAO) formed by an anodizing process;

wherein the first surface and the second surface of the aluminum board respectively form an anodic aluminum oxide layer;

wherein the electromagnet core is mounted on the anodic aluminum oxide layer on the first surface;

wherein the anodic aluminum oxide layer on the first surface, the anodic aluminum oxide layer on the second surface, and the AAO formed inside the through vias completely cover the aluminum board.

2. The embedded inductor structure as claimed in claim 1, further comprising:

a first dielectric layer, mounted on the first surface of the aluminum board, covering the electromagnet core;

a second dielectric layer, mounted on the second surface of the aluminum board;

wherein the through vias penetrate through the first dielectric layer and the second dielectric layer;

wherein the coil wraps around the electromagnet core and parts of the first dielectric layer and the second dielectric layer.

3. The embedded inductor structure as claimed in claim 1, wherein each of the through vias comprises at least one sub-through via;

wherein each of the at least one sub-through via of the through vias is at least one hexagonal sub-through via.

4. The embedded inductor structure as claimed in claim 1, wherein each of the through vias is a hexagonal through via.

* * * * *